United States Patent [19]
Misra

[11] Patent Number: 5,233,306
[45] Date of Patent: Aug. 3, 1993

[54] METHOD AND APPARATUS FOR MEASURING THE PERMITTIVITY OF MATERIALS

[75] Inventor: Devendra K. Misra, Whitefish Bay, Wis.

[73] Assignee: The Board of Regents of the University of Wisconsin System, Milwaukee, Wis.

[21] Appl. No.: 655,755

[22] Filed: Feb. 13, 1991

[51] Int. Cl.$^5$ .......................................... G01R 27/04
[52] U.S. Cl. .................... 324/601; 324/646; 324/642; 324/643
[58] Field of Search .............. 324/630, 601, 605, 638, 324/642, 643, 646; 128/804

[56] References Cited

U.S. PATENT DOCUMENTS 4,507,602  3/1985  Aguirre .............................. 324/638
5,047,725  9/1991  Strid et al. .......................... 324/601

OTHER PUBLICATIONS

A Quasi-Static Analysis of Open-Ended Coaxial Lines, Misra, IEET transaction Oct., 1987, pp. 925-928.
Reflection of an Open-Ended Coaxial Line and Application to Nondestructive Measurement of Materials, Mosig, et al., Mar., 1981, pp. 46-51.
Measurement of Radio Frequency Permittivity of Biological Tissues with an Open-Ended Coaxial Line: Part II-Experimental Results, Stuchly, et al., Jan., 1982, pp. 87-92.
Dielectric Measurements with an Open-Ended Coaxial Probe, Marsland and Evans, Aug. 1987, pp. 341-349.
Noninvasive Electrical Characterization of Materials at Microwave Frequencies Using an Open-Ended Coaxial Line: Test of an Improved Calibration Technique, Misra, et al., Jan., 1990, pp. 8-14.
A Study on Coaxial Line Excited Monopole Probes for In Situ Permittivity Measurements, Misra, Dec., 1987, 5 pages.

Primary Examiner—Kenneth A. Wieder
Assistant Examiner—Jose M. Solis
Attorney, Agent, or Firm—Foley & Lardner

[57] ABSTRACT

A method and apparatus for determining the permittivity of a sample is disclosed. The method includes applying an AC electrical signal in the microwave frequency range via a coaxial probe having an end position near the sample and measuring the reflection coefficient of the sample. The complex permittivity of the sample is determined from an admittance parameter of the sample/probe combination and a system constant. The system constant is determined by measuring the reflection coefficients of four standards having known complex permittivity. The admittance parameter of the sample/probe combination is determined from the admittance parameters of two standards/probe combinations and the measured reflection coefficients of the sample and the four standards. The admittance parameters of the two standard/probe combinations are determined from the known complex permittivities of the two standards and the system constant. The apparatus includes a coaxial probe having an end positioned near the sample, a microwave frequency generator and a device for measuring a reflection coefficient are connected to the other end of the coaxial probe. A microprocessor determines the complex permittivity of the sample from the measured reflection coefficients of the sample and four standards having known complex permittivities.

13 Claims, 3 Drawing Sheets

□ - Calculated Real  ○ - Calculated Imaginary
■ - Measured Real  ● - Measured Imaginary

METHOD AND APPARATUS FOR MEASURING THE PERMITTIVITY OF MATERIALS

FIELD OF THE INVENTION

This invention relates generally to measuring the complex permittivity of materials and, in particular, to using an open-ended coaxial probe to measure the complex permittivity of materials at microwave frequencies.

BACKGROUND OF THE INVENTION

Nondestructive methods for measuring the dielectric properties of materials are needed in biomedical and industrial applications. Because the interaction of an electromagnetic field with a material is highly dependent upon the electrical properties of that material, many electrical properties of a material may be determined by measuring how an electromagnetic wave interacts with that material. However, the precision with which one can determine how an electromagnetic wave interacts with a given material depends upon how accurately the complex permittivity of the material is known. A method for determining the complex permittivity is thus needed.

An accurate determination of the complex permittivity of a sample can be beneficial in carrying out certain biomedical procedures, such as electromagnetic thawing of cryo-preserved organs and tissues, electromagnetically-induced hyperthermia in cancer treatment, detection of pathological conditions in tissues and diagnostic monitoring applications such as lung water content. Since these processes are often carried out at microwave frequencies, the complex permittivity, which is frequency dependent, is of particular interest at microwave frequencies.

Industrial uses of complex permittivity measurements include monitoring the electrical characteristics of a material produced by or used in a manufacturing process. For example, water content of a material may be monitored by measuring the electrical characteristics of the material. Industrial processes may require that the complex permittivity be measured continuously or at frequent intervals as a material passes the measurement point on a production line. Such uses require that the permittivity be determined in "real time" (nearly instantaneously), so that appropriate action may be taken if a flaw is detected.

Conventional methods of determining complex permittivity at microwave frequencies are unsuitable for use in biomedical or industrial applications. For example, one method requires cutting, polishing and then placing the sample in a suitable waveguide or cavity. Another method, utilizing free-space techniques, is based on the reflection and transmission of electromagnetic waves radiated by a narrow beam antenna. This method requires that the sample have a relatively large plane surface. Samples used in biomedical or industrial applications often do not provide such a large plane surface.

Coaxial line excited monopole probes have been suggested for use in the electrical characterization of materials. However, an electric monopole probe is frequency sensitive and useful only when it is inserted into the material medium. Further, an electric monopole probe requires a relatively large sample volume which is not practical in many cases.

Prior art methods have attempted using an open-ended coaxial line for electrical characterization of a sample because using such a method should not require destruction of the sample and would be useful over a broad frequency band. Utilizing a coaxial line or probe to electrically characterize a material entails measuring the reflection coefficient or input impedance of a sample material and, from the measured data, determining the dielectric properties of the material. Prior art methods have not been successful in providing an effective way to relate the measured data to the dielectric properties of the material.

In one approach, nomograms are generated at three frequencies to determine the complex permittivity of a material from the measured reflection coefficient for an SR7 type coaxial line at the three frequencies. See Mosig et. al., "Reflection of an Open-ended Coaxial Line and Application to Nondestructive Measurement of Materials," *IEEE Transactions Instrum. Meas.*, Vol. IM. 30, No. 1, pp. 46-51, March, 1981. However, since many more nomograms are necessary to cover the entire frequency range, and each set of nomograms is useful with only one probe, this method is not very practical. Moreover, generating the nomograms requires a large number of time consuming numerical computations.

Another prior art approach uses equivalent circuit parameters determined by the numerical computations of the nomogram method and empirical relations to provide an improved model having an acceptable accuracy up to only about 2 GHz. See Stuckly et. al., Measurement of Radiofrequency Permittivity of Biological Tissues with an Open-ended Coaxial Line, *IEEE Transactions Microwave Theory Tech.*, Vol. MTT-30, pp. 87-92, January, 1982.

More recently, the permittivity has been determined from measured data utilizing a bilinear transformation to account for imperfections in the measuring system in conjunction with an equivalent circuit model for a coaxial opening. See, Marzland and Evans, "Dielectric Measurements With an Open-ended Coaxial Probe," *Proc. Inst. Elec. Eng.*, Vol. 134, pp. 341-349, August, 1987. Because this technique is restricted at high frequencies by the inadequate circuit model for the probe, a quasi-static analysis of a coaxial sensor has been proposed to formulate a more accurate equivalent model, Misra, A Quasi-Static Analysis of Open-ended Coaxial Lines, *IEEE Trans. Microwave Theory Tech.*, Vol. MTT-35, pp. 925-928, October, 1987. In this method, a quasi-static approximation to the formula for the normalized aperture admittance ($Y_L$) of an open-ended coaxial line terminated by a semi-infinite medium on a ground plane is given as:

$$Y_L = j \frac{k^2}{\pi k_c \ln(b/a)} \int_a^b \int_a^b \int_0^\pi \cos\phi' \frac{e^{-jkr}}{r} d\phi' d\rho' d\rho \quad (1)$$

where $k = \omega\sqrt{\mu_0 \rho \epsilon^*}$, $r = |\rho^2 + \rho'^2 - 2\rho\rho'\cos\phi|^{\frac{1}{2}}$, and a and b are the inner and outer radii of the coaxial aperture, $k_c = \omega\sqrt{\mu_0 \epsilon_0 \epsilon_c}$, $\mu_0$ is the permeability of free space, $\epsilon^*$ is the complex permittivity of the semi-infinite medium, $\epsilon_c$ is the relative permittivity of the coaxial line and $\omega$ is the angular frequency of the electromagnetic fields. The calculations required to solve Equation 1 are time consuming and do not provide an easy method for determining the admittance of the sample.

Accordingly, a need persists for a method and apparatus for easily and accurately determining the complex permittivity of materials at microwave frequencies using an open-ended coaxial line. Such a method and apparatus should accurately relate, in real time, the measured parameters of a material such as the reflection coefficient or input impedance of the sample to dielectric properties of the sample at frequencies from about 100 MHz up to and above 20 GHz. Moreover, such a method and apparatus should be capable of measuring complex permittivity continuously or at frequent intervals.

SUMMARY OF THE INVENTION

A method for determining the permittivity of a sample according to the present invention, using a coaxial probe having a first end positioned near the sample and a second end, comprises the initial steps of applying an AC electrical signal in the microwave frequency range to the second end of the probe and measuring the reflection coefficient of a first, second, third and fourth standard, whose complex permittivities are known. From the measured reflection coefficients of four standards and their known complex permittivities, a system constant is determined. Admittance parameters of the combination of the probe and three standards, preferably three of the four standards used previously, are then determined from their known complex permittivities and the system constant. In a preferred embodiment, wherein one of three standards is a short circuit having infinite admittance, only the first and second of the four standards are needed to determine these admittance parameters. The steps of measuring the reflection coefficient of the sample and determining the admittance parameter of the sample and probe combination from the determined admittance parameters of the two standards and the measured reflection coefficients of the sample and the four standards are performed. Finally, the complex permittivity of the sample is determined from the admittance parameter of the sample/probe combination and the system constant.

According to a further aspect of the invention, an apparatus for determining the permittivity of a sample comprises a microwave source and a coaxial probe having a first end and a second end, wherein the first end is positioned near the sample. A reflection coefficient measuring device is coupled to the second end of the probe and to the microwave source for measuring the reflection coefficients of four standard materials. A microprocessor is also coupled to the reflection coefficient measuring device and has suitable means for receiving data indicative of the reflection coefficients of the sample and the four standards and determining the permittivity of the sample using the reflection coefficient data in accordance with the method of the invention.

According to another embodiment of the invention, an apparatus for determining the permittivity of a sample comprises a microwave source and first and second directional couplers. Each coupler has an input, a main output and an auxiliary output. The input of the first directional coupler is coupled to the microwave source, and the input of the second directional coupler is coupled to the main output of the first directional coupler. A coaxial probe has a first end positioned near the sample and a second end coupled to the main output of the second directional coupler. A first mixer is coupled to the auxiliary output of the first directional coupler and a local oscillator, and a second mixer is provided and coupled to the auxiliary output of the second directional coupler and the local oscillator. The first and second mixers are further coupled to a first and second first and second analog to digital converters, respectively. A microprocessor connected to the mixers has suitable means for receiving reflection coefficient data indicative of the sample and the standards, and determining the permittivity of the sample using the reflection coefficient data.

DETAILED DESCRIPTION OF THE PREFERRED EMBODIMENT

According to a preferred embodiment of the present invention, the complex permittivity of materials is determined from measured input reflection coefficient using a quasi-static analysis of an open-ended coaxial line. In general, collected data are used to correct for approximations in calculations used to determine the complex permittivity. More particularly, the complex permittivity of a sample is determined according to the invention by first measuring the reflection coefficient of four standard materials whose complex permittivities are known, and from the reflection coefficients determining a system constant which is characteristic of the probe. The admittance parameter of the probe/sample combination is next determined from the system constant and the reflection coefficient of the sample. Finally, the complex permittivity is determined from the admittance parameter of the probe/sample combination and the system constant. By utilizing four standards and determining the system constant, the complex permittivity may be quickly and accurately determined.

Figure 1:
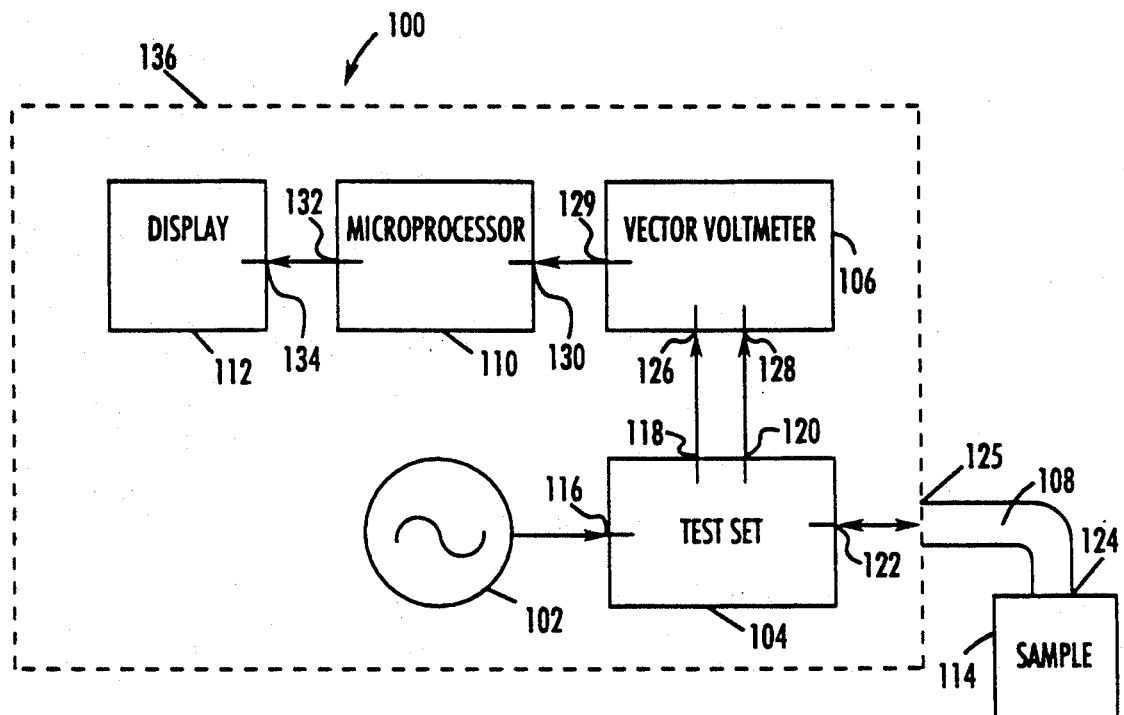
FIG. 1 is a schematic diagram of an apparatus according to the invention.

Referring now to FIG. 1, a permittivity measuring device designated generally as 100 comprises a microwave source 102, a reflection/transmission test set 104, a vector voltmeter 106, a probe 108, a microprocessor 110, and a display or other output device 112 which gives the complex permittivity of a sample 114.

Microwave source 102 should be capable of providing AC signals having frequencies from about 100 MHz to about 20 GHz, so that the complex permittivity may be obtained over a wide range of frequencies. Accordingly, both test set 104 and vector voltmeter 106 should be capable of operating at these frequencies. A network analyzer, which usually is capable of operating at higher frequencies than a vector volt meter, may be used in place of vector volt meter 106. Microwave source 102 is coupled to test set 104 and provides thereto the AC microwave signal it generates (the incident signal). Test set 104, in turn, is coupled to vector voltmeter 106 and probe 108, which is positioned near sample 114. The incident signal is provided by test set 104 to vector voltmeter 106 and to sample 114 through probe 108. The incident signal is reflected by sample 114 and provided through probe 108 back to test set 104. The reflected signal is then provided to vector voltmeter 106 by test set 104. Vector voltmeter 106 determines the reflection coefficient of sample 114, defined as the ratio of the magnitude and phase of the reflected signal to the incident signal, from the signals provided to it by test set 104. Vector voltmeter 106 is coupled to microprocessor 110, and provides microprocessor 110 with the reflection coefficient of sample 114. Microprocessor 110 then determines the complex permittivity of sample 114 and provides it to display 112 or any other similar output device.

More particularly, test set 104 has an input 116 coupled to microwave source 102, an incident wave output 118 coupled to vector voltmeter 106, a reflected wave output 120 also coupled to vector voltmeter 106, and a load port 122 coupled to probe 108 Input 116 receives the incident signal from microwave source 102 and provides it to incident wave output 118 and load port 122. The incident signal is transmitted by port 122 to sample 114 through probe 108, and a signal is reflected by sample 108 back through probe 108 to port 122. The reflected signal is provided by port 122 to reflected wave output 120. Output 118 thus provides the incident signal to vector voltmeter 106, and output 120 provides the reflected signal to vector voltmeter 106

Probe 108 is a coaxial line with an open first end 124 placed near sample 114 and a second end 125 coupled to port 122 of test set 104. The incident signal is received from port 122 on end 125 and transmitted to sample 114 on end 124. The incident signal is reflected by sample 114 and received by end 124 and transmitted to end 125 The reflected signal is then transmitted by end 125 to port 122 of test set 104. Since the analysis used by the present invention is based on the presence of an infinite sample, the size of probe 108 should be selected to ensure that fringing and radiation fields are contained within the material.

Vector voltmeter 106 has an incident wave input 126 coupled to output 118 of test set 104, a reflected wave input 128 coupled to port 122 of test set 104, and an output 129. Vector voltmeter 106 samples the signals on inputs 126 and 128 and determines the reflection coefficient of the sample/probe combination. A signal indicative of the reflection coefficient is provided on output 129. Other devices, such as a network analyzer capable of providing an output indicative of the reflection coefficient of sample 114, may be used in place of vector voltmeter 106. The device used to determine the reflection coefficients should be capable of operating at the frequencies at which measurements are being made. The output is preferably digital so that it may be provided directly to microprocessor 110 which receives it on a digital input 130. Input 130 may receive a parallel or series signal. If an analog output is provided by vector voltmeter 106, it can be digitized by an analog-to-digital (A/D) converter before it is provided to microprocessor 110.

Microprocessor 110 is preferably able to receive instruction inputs directly from the user in addition to the output of vector voltmeter 106. Microprocessor 110 should also be capable of providing output data on output 132 indicative of the complex permittivity of sample 114. Suitable logic in the form of hardware or software incorporated in microprocessor 110 determines the complex permittivity in a manner which will be described below.

Display 112 may be a CRT, LCD, printer, or other apparatus having an input 134, which receives the output data from microprocessor 110, and is capable of displaying the complex permittivity in an understandable form. The entire apparatus, except probe 108, may reside in a common housing 136 for ease of use.

In operation, before testing sample 114, reflection coefficient data are collected at a selected frequency for four standards, preferably an open-circuit, water, a short circuit, and methanol. The standards used for calibration should be chosen so their dielectric constants (the real portion of the complex permittivity) span a wide range of values. In any event, it is desirable to use standards having dielectric constants that define a range in which the dielectric constant of the sample being tested falls. This type of selection will generally provide more accurate results, especially at high frequencies. The applicant found that using standards having dielectric constants from two to eighty was adequate to determine the permittivity of glycerol and a 0.1 N saline solution. Also, as will be explained below, a short-circuit is chosen as one of the standards (the third standard in the equations below) to simplify the calculations performed by microprocessor 110. The reflection data for the standards is provided to microprocessor 110 for storage and later use in determining the permittivity of sample 114. The frequency selected is the frequency at which the complex permittivity of sample 114 will be measured. Data from the standards may also be collected at a number of frequencies, or during a predetermined frequency scan, in order to later determine the complex permittivity of sample 114 at the frequencies scanned. Time may be saved by first performing measurements at all frequencies of interest using the first standard, then at all frequencies of interest using the second standard, and so on.

Reflection coefficient data are collected for each standard by successively placing open end 124 of probe 108 in contact with each standard. In the case of an open circuit, end 124 should be positioned so that it is not in contact with any material. When collecting data for water or methanol, end 124 should be inserted into the liquid, and when collecting data for the short circuit, end 124 should be in contact with a conducting plane such as a piece of copper. After end 124 of probe 108 is properly positioned, microwave source 102 generates a signal at the selected frequency. Vector voltmeter 106 samples the transmitted and reflected signals and determines the reflection coefficient, which is then provided to microprocessor 110.

Following the collection of the data for the standards, end 124 of probe 108 is placed in contact with sample 114. If sample 114 is a solid, end 124 should be firmly in contact with sample 114. If sample 114 is a liquid, end 124 should be inserted into sample 114. A microwave signal at the frequency of interest is provided by microwave source 102, and the reflection coefficient is determined by vector voltmeter 106. The reflection coefficient is then transmitted to microprocessor 110. When measuring the reflection coefficient of sample 114, microwave source 102 should operate at the same frequency at which the standards data was collected. Similarly, if a frequency scan was used to acquire the standards data, an identical frequency scan should be used for testing sample 114.

The complex permittivity of the sample is then determined utilizing a set of instructions, e.g. a computer program, embodying the formulas described below, which correspond to an equivalent circuit model. The calculated permittivity is provided as a signal by microprocessor 110 to display 112. System 100 thus determines the complex permittivity of sample 114.

In industrial applications that require taking continuous or frequent permittivity measurements, the reflection data of the standards from one measurement at a given frequency may be used for other measurements at the given frequency. This facilitates industrial applications of the present invention because probe 108 may be in contact with a moving web or membrane and continuously monitor the complex permittivity. Alternatively, probe 108 could be in intermittent contact with samples passing by, or the probe could be moved in such a way as to scan a sample. In either case, the standards data does not need to be regenerated for each measurement. However, periodically standards data should be reacquired to correct for instrument drift, temperature change and other changing parameters.

Figure 2:
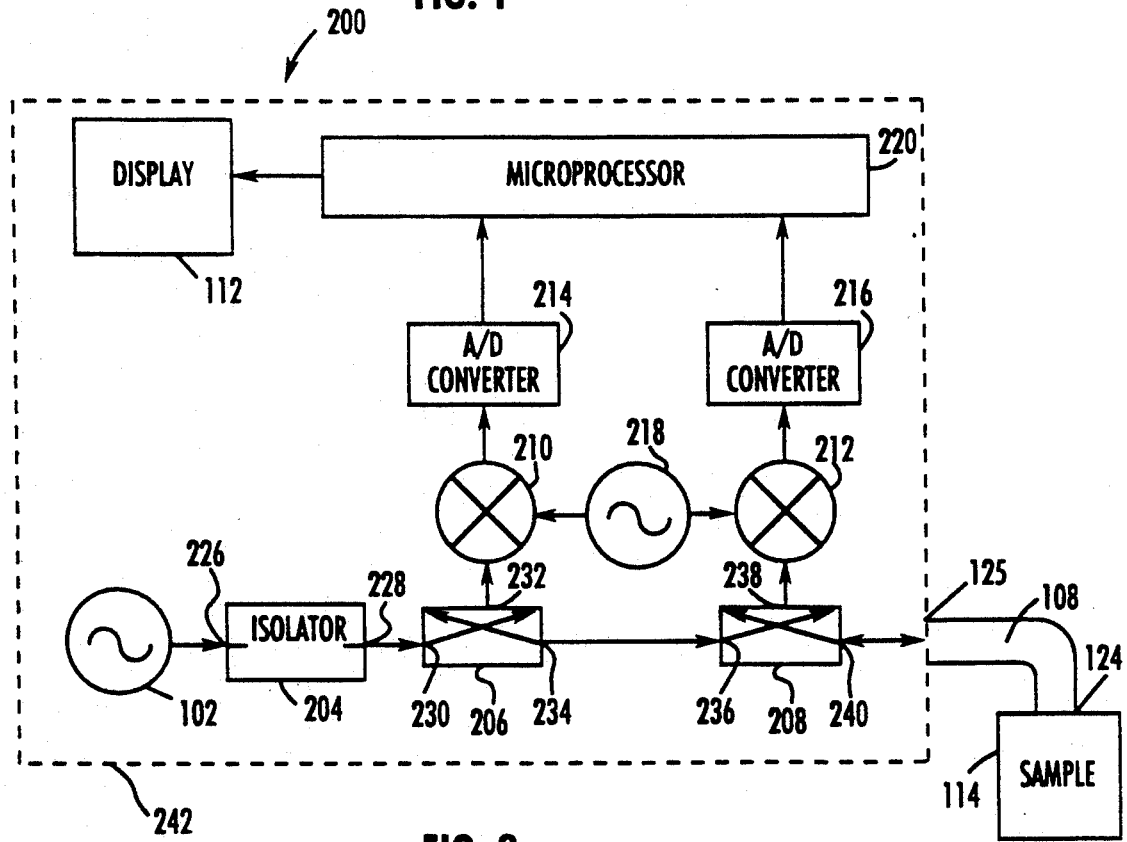
FIG. 2 is a schematic diagram of an alternative apparatus of the invention.

An alternative embodiment of an apparatus of the invention is shown in FIG. 2, wherein a permittivity measuring system 200 comprises microwave source 102, an isolator 204, a pair of directional couplers 206 and 208, probe 108, a pair of mixers 210 and 212, a pair of A/D converters 214 and 216, a local oscillator 218, a microprocessor 220, and display 112 which reside in a unitary structure 242 and cooperate to determine the permittivity of sample 114. Isolator 204 is coupled to microwave source 102 and receives an AC microwave signal from it (the incident signal). Isolator 204 is also coupled to directional coupler 206 and provides the incident signal to it. Directional coupler 206 is also coupled to directional coupler 208 and mixer 210, both of which receive the incident signal from directional coupler 206. Directional coupler 208 is further coupled to mixer 212 and probe 108, which is positioned near sample 114. The incident signal is provided by directional coupler 208 to sample 114 through probe 108, and a signal is reflected by sample 114 through probe 108 back to directional coupler 208. The reflected signal is also provided by directional coupler 208 to mixer 212. Mixers 210 and 212 are further coupled to A/D converters 214 and 216, respectively, local oscillator 218, and microprocessor 220. The incident and reflected signals are mixed with a signal from local oscillator 218 by mixers 210 and 212, respectively, and provided to A/D converters 214 and 216, respectively, for digitization. The digital outputs of A/D converters 214 and 216 are provided to microprocessor 220, which determines the reflection coefficient of sample 114. From the reflection coefficient, and a system constant, microprocessor 220 determines the complex permittivity of sample 114 quickly and accurately.

Isolator 204 has an input 226 coupled to microwave source 102 and an output 228 coupled to directional coupler 206. Isolator 204 provides the incident wave received from microwave source 102 to directional coupler 206 and protects microwave source 102 by preventing any reflected signals from reaching it. Directional coupler 206 has an input 230 coupled to output 228 of isolator 204, an output 232 coupled to mixer 210 and a port 234 coupled to directional coupler 208. The incident signal is received through input 230 and provided to mixer 210 on output 232, and to directional coupler 208 on port 234. Similarly, directional coupler 208 has an input 236 coupled to port 234 of directional coupler 206, an output 238 coupled to mixer 212, and a port 240 coupled to end 125 of probe 108. The incident signal is received on input 236 and provided by port 240 to sample 114 through probe 108. The incident signal is reflected by sample 114 back through probe 108 to port 240. The reflected signal is provided by port 240 to output 238. Thus, output 232 of directional coupler 206 provides the incident signal to mixer 210 and output 238 of directional coupler 208 provides the reflected signal to mixer 212.

Mixers 210 and 212 make the incident and reflected signals more readily digitizable. Since it is difficult and expensive to digitize a signal in the GHz range, mixers 210 and 212 mix the signals received from directional couplers 206 and 208, respectively, with a signal from local oscillator 218 The mixing lowers the frequency of the data signals and, therefore, allows for easier digitization. To accomplish this, local oscillator 218 should operate at a frequency $f_2$, which is slightly different from $f_1$, the frequency at which microwave source 102 is operating. The outputs of mixers 210 and 212 each have a frequency $f_3$ equal to the difference between $f_1$ and $f_2$. For example, if $f_1$ is selected to be 10.0 GHz and an appropriate value for $f_2$ is 10.5 GHz, $f_3$ would be 0.5 GHz. In any event, $f_2$ should be chosen such that the output of mixers 210 and 212 may be digitized without distorting the waveform. Preferably, $f_3$ should be less than one-half of the digitizing rate of A/D converters 214 and 216 to meet the Nyquist requirement for digitizing a signal. When the user selects an operating frequency for microwave source 102 (the frequency at which permittivity is to be measured) the frequency of local oscillator 218 is preferably automatically adjusted to an appropriate value. Such an automatic adjustment is accomplished by combining the output of the frequency selection mechanism of microwave source 102 with an offset, and using the combination to select the frequency of local oscillator 218.

The outputs of mixers 210 and 212 are provided to A/D converters 214 and 216, respectively, where they are digitized and the resulting signals sent to microprocessor 220. Microprocessor 220 is suitably programmed to determine the reflection coefficients from the digital data and then perform the necessary steps to provide the complex permittivity of the sample.

The operation of permittivity measuring system 200 is similar to that of permittivity measuring system 100 in that, prior to testing sample 114, reflection data are collected for four standards. Again, the standards are preferably an open circuit, a short circuit, water and methanol. The data collected for these standards is used to determine the permittivity of sample 114. Reflection coefficient data are collected for each standard by first placing the end of probe 108 in contact with a sample of each standard.

The formulas derived below allow the admittance parameter of sample 114 to be determined from measured reflection coefficients, and the permittivity to then be determined. The stationary formulation for the input admittance of a coaxial line terminated by a semi-infinite medium on a ground plane given in Equation 1 above is simplified for practical evaluation of permittivity. Using the assumption that the coaxial opening is electrically very small, Equation 1 may be approximated by taking the first few terms of the Taylor series expansion for the exponential term in the integral in Equation 1. The second term of this expansion goes to zero and the fourth term reduces to the well known radiation term of coaxial probes. Following the expansion and approximations, Equation 1 may be rewritten as:

$$Y_L \approx j \frac{2\omega I_1}{[\ln(b/a)]^2} \epsilon^* - j \frac{\omega^3 \mu_0 I_2}{[\ln(b/a)]^2} \epsilon^{*2} + \frac{\pi \omega^4 \mu_0^{3/2}}{12} \left[ \frac{b^2 - a^2}{\ln(b/a)} \right]^2 \epsilon^{*5/2} \quad (2)$$

where $$I_1 = \int_a^b \int_a^b \int_0^\pi \frac{\cos\phi'}{[\rho^2 + \rho'^2 - 2\rho\rho'\cos\phi']^{\frac{1}{2}}} d\phi' d\rho' d\rho$$

and $$I_2 = \int_a^b \int_a^b \int_0^\pi \cos\phi' [\rho^2 + \rho'^2 - 2\rho\rho'\cos\phi']^{\frac{1}{2}} d\phi' d\rho' d\rho.$$

$I_1$ and $I_2$, which require time consuming calculations to solve, are not evaluated according to the present invention, as explained below.

The first term of Equation 2 represents a capacitance of the sample, the second term represents a capacitance of the sample that changes with angular frequency ($\omega$), and the third term represents the radiation conductance of the sample. In formulating Equation 2, an infinite conducting flange is assumed over the coaxial aperture. However, an infinite conducting flange is not used in practice because it is inconvenient. Also, small discontinuities between the aperture and vector voltmeter 106 (due to connectors, etc.) cannot be avoided.

In order to account for these imperfections, the circuit is modeled by an equivalent two-port network connected between vector voltmeter 106 and open end of probe 108. The actual admittance of the aperture terminated by a sample is evaluated from the measured reflection coefficient as follows:

$$\left[ \frac{Y_S - Y_1}{Y_S - Y_2} \right] \left[ \frac{Y_3 - Y_2}{Y_1 - Y_3} \right] = \frac{\delta_{s1} \delta_{32}}{\delta_{s2} \delta_{13}} \quad (3)$$

where $Y_S$ is the desired aperture admittance terminated by the sample material, $Y_{1,2,3}$ are aperture admittances with standards one, two and three terminating the probe, respectively, and $\delta_{ij}$, which is called reflection difference data, is equal to $\Gamma_i - \Gamma_j$, with $\Gamma_n$ representing the measured reflection coefficient for the nth material. Equation 3 is shown with the first, second and third standards, but it could have been written using any three standards.

The right-hand side of Equation 3 is determined from the measured data, $Y_1$ and $Y_2$ are calculated from Equation 2 using the known values of $\epsilon^*$ for the standards, and a short circuit is used as the third standard so that $Y_3 = \infty$. To avoid having to evaluate integrals $I_1$ and $I_2$ to calculate $Y_1$ and $Y_2$, a fourth standard is used, as will be shown below. Equation 2 may be rewritten as:

$$\overline{Y}_L = \epsilon_r^* + \xi \epsilon_r^{*2} + \xi_1 \epsilon_r^{*2.5} \quad (4)$$

where $\epsilon_r^*$ is the complex relative permittivity of the material, $\xi$ and $\xi_1$ are constants dependent on the frequency and the dimension of the aperture, and $Y_L$ represents a transformed parameter of aperture admittance $Y_L$. Because $\xi$ and $\xi_1$ are not dependent on the sample being tested, they may be determined using the data from the standards.

Generally, the radiation from the coaxial aperture, which is represented by the third term in Equation 4, may be neglected at lower microwave frequencies. Therefore, Equation 4 can be approximated as follows:

$$\overline{Y}_L = \epsilon_r^* + \xi \epsilon_r^{*2} \quad (5)$$

Equations 3 and 5 can be used to determine the admittance parameter $\bar{y}_s$ which, in turn, can be used to calculate the complex permittivity of the sample as shown below. Solving Equation 3 for $\bar{y}_s$ and, using a short circuit as the third standard so that $\bar{y}_3 = \infty$, we obtain:

$$y_s = \frac{y_1 + \Delta' y_2}{1 + \Delta'} \quad (6)$$

where $$\Delta' = \frac{\delta_{s1} \delta_{32}}{\delta_{s2} \delta_{13}},$$

which we will call the reflection difference ratio for the sample, standard 1, standard 2 and standard 3. Of course, $\bar{y}_s$ may be determined if one of the three standards used in Equation 3 is not a short circuit, but the calculations will be more time-consuming. The values of $\bar{y}_{1,2}$ are determined as part of the probe calibration and are calculated from Equation 5 for given complex relative permittivities of standards 1 and 2 (an open circuit and water in the preferred embodiment), respectively, at the operating frequency.

The unknown constant $\xi$ in Equation 5, which is called the system constant, is determined from the measured reflection coefficients and the known complex permittivities for standards 1, 2, 3, and 4. Equation 3 may be rewritten, substituting the fourth standard for the sample, to obtain:

$$\left[ \frac{Y_4 - Y_1}{Y_4 - Y_2} \right] \left[ \frac{Y_3 - Y_2}{Y_1 - Y_3} \right] = \frac{\delta_{41} \delta_{32}}{\delta_{42} \delta_{13}} \quad (3A)$$

Substituting the expression given in Equation 5 for $y_n$, which gives $\bar{y}_n$ in terms of $\epsilon^*_n$, for standards 1, 2 and 4, and using $\bar{y}_3 = \infty$, Equation 3A may be solved for $\xi$ to obtain:

$$\xi = \frac{(1 + \Delta) \epsilon_4^* - \epsilon_1^* - \Delta \epsilon_2^*}{\epsilon_1^{*2} + \Delta \epsilon_2^{*2} - (1 + \Delta) \epsilon_4^{*2}} \quad (7)$$

where $$\Delta = \frac{\delta_{41} \delta_{32}}{\delta_{42} \delta_{13}}$$

and $\delta_{ij}$ were defined earlier.

The values for $\xi$ and $\bar{y}_s$ are used in Equation 5 to solve for $\epsilon^*_s$, thus determining the complex permittivity of the sample.

According to the method of the invention, the complex permittivity of a sample may be determined by finding a system constant for a given frequency using reflection data from four standards, having known complex permittivities at the given microwave frequency, measuring the reflection coefficient of the sample, and then determining the permittivity of the sample. The standards are preferably an open circuit, a short circuit, water and methanol. The system constant does not need to be redetermined before each sample measurement, but should be re-determined at such intervals to prevent instrument drift, changing temperatures or other changing parameters from significantly reducing accuracy.

The system constant may also be determined for a number of frequencies, or using a frequency scan. The order of the standard measurements does not matter, but the same frequency or frequencies should be used for each standard. Thus, it may be time efficient to collect reflection coefficient data using standard 1 with a frequency scan, then standard 2 with an identical scan, etc. In any event the sample should be tested at the same frequencies that the calibrations were performed at.

One benefit of not having to redetermine the system constant before each measurement is that in industrial applications the probe may be scanned over a material and determine the complex permittivity as a function of position on the material. Similarly, in a biomedical application the probe could be moved across a patients skin to determine the complex permittivity of the patient's skin as a function of position. Such information is useful in locating tumors or other abnormal growths which may have complex permittivities different than that of normal tissues.

The method may be performed using the apparatus disclosed above, or, alternatively, with conventional reflection/transmission equipment. For example, the complex permittivity of a sample was successfully measured using an HP-8620C sweeper main frame capable of generating 16 MHz to 20 GHz signals as microwave source 102. The HP-8620C sweeper main frame was connected to an HP-85044A transmission/reflection test set capable of operating from 300 kHz to 3 GHz. An HP-8508A vector voltmeter capable of operating from 300 kHz to 2.4 GHz was connected to the HP85044A transmission/reflection set, as was a typical open ended coaxial probe having an outer diameter of 3.6 millimeters. An HP-8510 automatic network analyzer was used in place of the vector voltmeter for frequencies greater than 2.4 GHz. The equipment (available from Hewlett Packard Corporation) was used to gather the reflection coefficient data. The data were manually read off of the HP-8508A vector voltmeter or the HP-8510 automatic network analyzer and the steps to provide the complex permittivity were performed on a personal computer.

Figure 3:
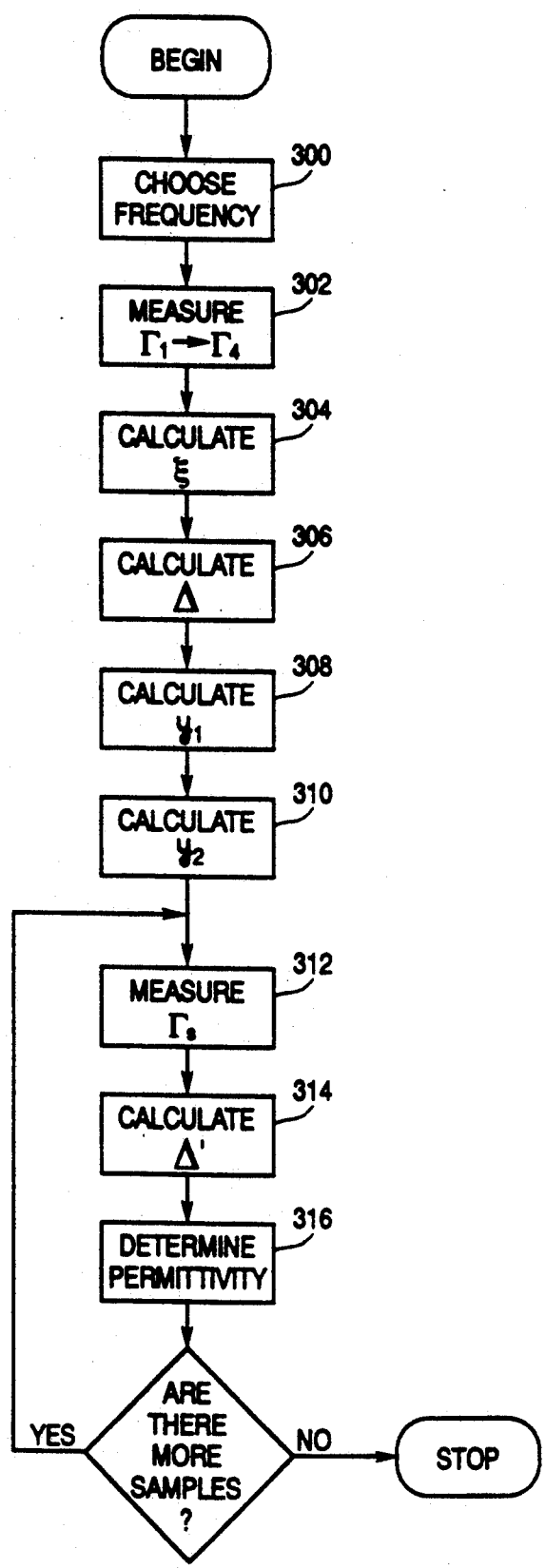
FIG. 3 is a flow chart showing the steps of a method of the invention.

Referring now to FIG. 3, one method of the present invention includes the steps of selecting a frequency of operation (step 300) and collecting reflection data for standards 1, 2, 3 and 4 (step 302). In step 304 $\xi$ is calculated according to Equation 7, and in step 306 $\Delta$ is calculated. In steps 308 and 310, $y_1$ and $y_2$ are calculated, respectively, according to Equation 5. In step 312 reflection data for the sample is collected and $\Delta'$ is calculated at step 314. The complex permittivity is determined at step 316, using the data collected in step 310 and the values of $\xi$, $\Delta$, and $\Delta'$, determined in steps 304, 306, and 314, respectively, according to Equation 6. If the complex permittivity of other samples is to be measured, the system returns to step 312. Each of steps 302-316 may be performed at a number of different frequencies, if so desired.

Using the method and apparatus described above, the complex relative permittivities of several samples were determined and compared with the corresponding data available in the literature. Since Equation 5 is quadratic in $\epsilon_r^*$, mathematically two solutions of complex permittivity are found. However, the linear approximation of this equation (i.e. $\xi=0$) can be used at this point to determine the correct permittivity from the two mathematical solutions.

Figure 4:
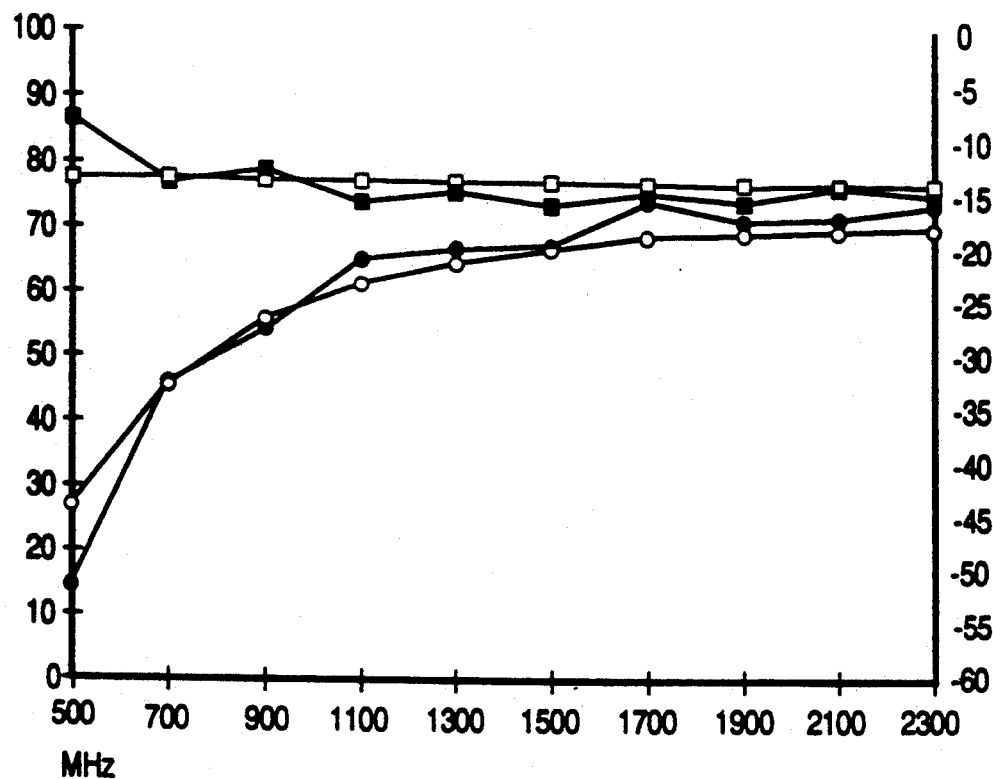
FIG. 4 is a graph plotting the relative real component of the complex permittivity on the left vertical axis and the relative imaginary component of the complex permittivity on the right vertical axis of a 0.1 N saline solution versus frequency, shown on the horizontal axis, determined according the invention.

FIG. 4 shows the complex relative permittivity of a 0.1 N saline solution determined by the present invention at room temperature compared with values calculated by Equation 8, which was formulated in accordance with the literature. See J. A. Saxton et. al., "Electrical Properties of Sea Water—Reflection and Attenuation Characteristics at V.H.F.," *Wireless Engr.*, pp 269-275, Oct. 1952.

$$\epsilon_r^* = 4.9 + \frac{72.72}{(1 + j54.76)(10^{-12})f} - j\frac{(21.06)(10^9)}{f} \quad (8)$$

The real component of the measured values, shown by solid squares, is seen to be in close agreement with the real component of the calculated values, shown by hollow squares. The left-hand vertical axis shows the relative magnitude of the real components and the horizontal axis is frequency in MHz. The imaginary component of the measured values, shown by solid circles, is also seen to be in close agreement with the imaginary component of the calculated values, shown by hollow circles. The right-hand vertical axis shows the relative magnitude of the imaginary components. For example, at the signal frequency of 700 MHz, the measured value of 77-j32 was found, which is in excellent agreement with the 78-j33 obtained from Equation 8.

Figure 5:
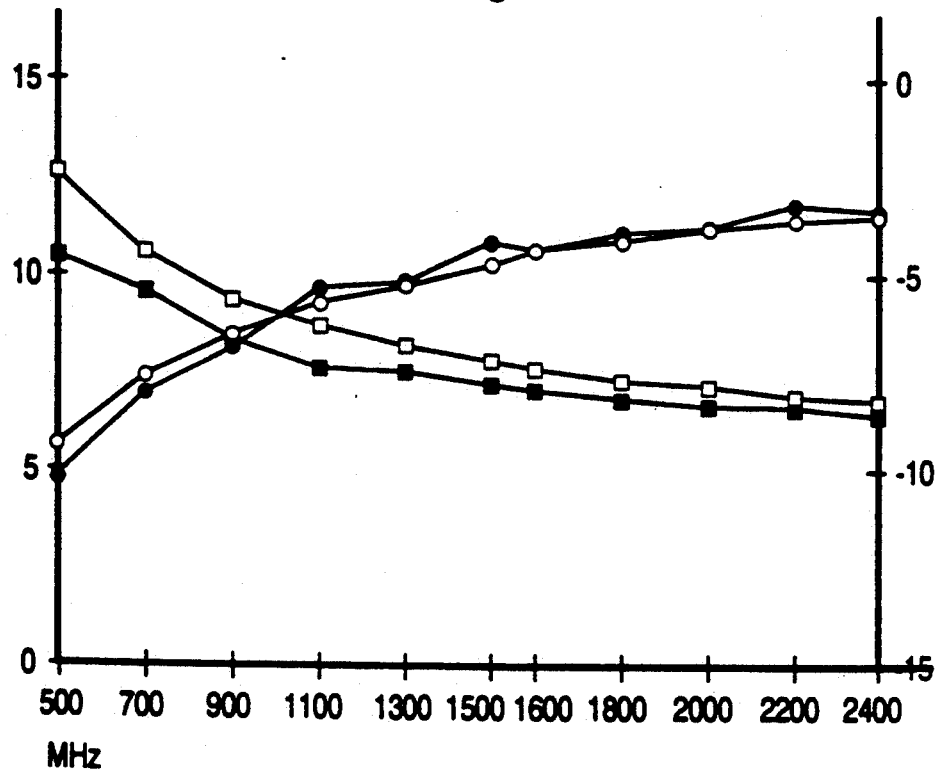
FIG. 5 is a graph plotting the relative real component of the complex permittivity on the left vertical axis and the relative imaginary component of the complex permittivity on the right vertical axis of glycerol at 23° C. versus frequency, shown on the horizontal axis, determined according to the invention.

The complex permittivity of glycerol determined by the present method at 23° C. is shown in FIG. 5, using the same symbols as FIG. 4. These results are also very close to the values calculated by Equation 9 which was formulated in accordance with the literature. See Buckley et. al., "Tables of Dielectric Dispersion Data for Pure Liquids and Dilute Solutions," National Bureau of Standards Circular 598, Nov., 1958, Davidson et. al., "Dielectric Relaxation in Glycerine," *J. Chem. Phys.*, Vol. 18, p1417, 1950, and Morgan, "Two Types of Dielectric Polarization," *Trans. Amer. Electrochem. Soc.*, Vol. 65, pp 109-118, 1934.

$$\epsilon_r^* = 4.18 + \frac{38.32}{[1 + j\omega*2.49*10^{-9}]^{0.6}} \quad (9)$$

where $\omega$ is the angular frequency of the microwave signal and $\epsilon^*$ is the complex relative permittivity of glyercol.

The examples given above are not intended to limit the scope of the appended claims, but are for exemplary purposes only. As one skilled in the art will recognize, various components and steps may be modified or substituted and still remain within the scope of the invention.

I claim:

1. A method for determining the permittivity of a sample using a coaxial probe having a first end positioned at the sample and a second end, comprising the steps of:

applying an AC electrical signal in the microwave frequency range to the second end;

measuring the resulting reflection coefficient of the sample;

determining an admittance parameter of the sample and probe combination using the admittance parameters of a pair of standards determined from their known complex permittivities and a system constant, and measured reflection coefficients of the sample and four standards having known complex permittivities, wherein the system constant has been determined from the measured reflection coefficients of the four standards and the known complex permittivities of the four standards; and determining the complex permittivity of the sample from the admittance parameter of the sample and the system constant.

2. The method of claim 1 wherein said AC electric signal has a frequency of between 100 MHz and 20 GHz.

3. In a method for determining the permittivity of a sample using a coaxial probe having a first end positioned at the sample and a second end, including the steps of applying an AC electrical signal in the microwave frequency range to the second end, measuring the resulting reflection coefficient of the sample, determining an admittance parameter of the sample and probe combination, and determining the complex permittivity of the sample from an admittance parameter of the sample, the improvement which comprises:

determining a system constant $\xi$ to determine complex relative permittivity $\epsilon_r^*$ according to the equation:

$$\overline{y}_L = \epsilon_r^* + \xi \epsilon_r^{*2}$$

wherein $\overline{y}_L$ represents the admittance parameter of aperture admittance $y_L$.

4. A method for determining the permittivity of a sample using a coaxial probe having a first end positioned at the sample and a second end, comprising the steps of:

applying an AC electrical signal in the microwave frequency range to the second end;

measuring the reflection coefficient of a first, second, third and fourth standard having known complex permittivities;

determining a system constant from the measured reflection coefficients of the first, second, third and fourth standards and the known complex permittivities of the first, second, third and fourth standards;

determining an admittance parameter of the combination of the probe and the first standard, and the combination of the probe and the second standard, from their known complex permittivities and the system constant;

measuring the reflection coefficient of the sample;

determining the admittance parameter of the sample and probe combination from the determined admittance parameter of the first and second standards and the measured reflection coefficients of the sample and the first, second, third and fourth standards; and determining the complex permittivity of the sample from the admittance parameter of the sample and the system constant.

5. The method of claim 4, wherein the step of applying an AC electric signal in the microwave range includes the step of applying an AC electric signal having a frequency of between 100 MHz and 20 GHz.

6. The method of claim 4, wherein each step is performed at a plurality of frequencies.

7. The method of claim 4, wherein said first standard is an open circuit, said second standard is water, said third standard is a short circuit, and said fourth standard is ethanol.

8. The method of claim 4, wherein the standards have dielectric constants different from each other and spanning a range of values, and the dielectric constant of the sample being tested falls within the range of dielectric constants defined by the standards.

9. An apparatus for determining the permittivity of a sample comprising:

a coaxial probe having a first end positioned at the sample and a second end;

means for applying an AC electrical signal in the microwave frequency range to the second end;

means for measuring the resulting reflection coefficient of the sample;

means for determining an admittance parameter of the sample and probe combination using the admittance parameter of a pair of standards determined from their known complex permittivities and a system constant, and measured reflection coefficients of the sample and four standards having known complex permittivities, wherein the system constant has been determined from the measured reflection coefficients of the four standards and the known complex permittivities of the four standards; and means for determining the complex permittivity of the sample from the admittance parameter of the sample and the system constant.

10. The apparatus of claim 9, wherein said means for determining the complex permittivity further comprises means for solving $\overline{y}_s = \epsilon_r^* + \xi \epsilon_r^{*2}$, where $\epsilon_r^*$ is relative complex permittivity of the sample, $y_s$ is an admittance parameter of the sample and $\xi$ is a system constant.

11. An apparatus for determining the permittivity of a sample comprising:

a microwave source;

first and second directional couplers, each of said first and second couplers having an input, a main output and an auxiliary output, wherein said input of said first directional coupler is coupled to said microwave source and said input of said second directional coupler is coupled to said main output of said first directional coupler;

a coaxial probe having a first end and a second end, said first end positioned near the sample and said second end coupled to said main output of said first directional coupler;

a local oscillator coupled to a first and second mixer, wherein said first mixer is further coupled to said auxiliary output of said first directional coupler and said second mixer is further coupled to said auxiliary output of said second directional coupler;

first and second analog to digital converters, wherein said first analog to digital converters is coupled to said first mixer and said second analog to digital converters is coupled to said second mixer;

microprocessor means coupled to said first and second mixers for receiving reflection coefficient data indicative of the sample and for determining the permittivity of the sample using the reflection coefficient data.

12. The apparatus of claim 10, further comprising a display coupled to said microprocessor means.

13. The method of claim 1, wherein the standards have dielectric constants different from each other and spanning a range of values, and the dielectric constant of the sample being tested falls within the range of dielectric constants defined by the standards.

* * * * *